(12) United States Patent
Reinmuth

(10) Patent No.: US 11,125,771 B2
(45) Date of Patent: Sep. 21, 2021

(54) MICROMECHANICAL Z-INERTIAL SENSOR

(71) Applicant: Robert Bosch GmbH, Stuttgart (DE)

(72) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 207 days.

(21) Appl. No.: 16/440,265

(22) Filed: Jun. 13, 2019

(65) Prior Publication Data

US 2019/0383853 A1 Dec. 19, 2019

(30) Foreign Application Priority Data

Jun. 14, 2018 (DE) .......................... 102018209500.0

(51) Int. Cl.
| | | |
|---|---|---|
| *G01P 15/125* | (2006.01) | |
| *G01P 15/08* | (2006.01) | |
| *G01C 19/5712* | (2012.01) | |
| *B81B 3/00* | (2006.01) | |

(52) U.S. Cl.
CPC .......... *G01P 15/125* (2013.01); *B81B 3/0037* (2013.01); *G01C 19/5712* (2013.01); *B81B 2201/0235* (2013.01); *B81B 2203/0163* (2013.01); *B81B 2203/0181* (2013.01); *B81B 2203/04* (2013.01); *G01P 2015/0854* (2013.01)

(58) Field of Classification Search
CPC .... G01P 15/125; G01P 15/0802; G01P 15/08; G01P 2015/0822; G01P 2015/0825; G01P 2015/0831; G01P 2015/0837
See application file for complete search history.

(56) References Cited

U.S. PATENT DOCUMENTS

| | | | |
|---|---|---|---|
| 2011/0079081 A1* | 4/2011 | Weiss ................. | B81C 1/00238 73/514.32 |
| 2014/0338450 A1* | 11/2014 | Classen ............... | G01P 15/125 73/514.32 |
| 2015/0096378 A1* | 4/2015 | Kigure ................ | G01P 1/003 73/514.32 |
| 2015/0183632 A1* | 7/2015 | Su ....................... | B81B 7/008 257/415 |
| 2015/0198493 A1* | 7/2015 | Kaelberer ........... | B81B 3/0037 73/718 |
| 2019/0135613 A1* | 5/2019 | Reinmuth ........... | G01P 15/0802 |
| 2019/0185316 A1* | 6/2019 | Reinmuth ........... | B81B 3/0021 |

FOREIGN PATENT DOCUMENTS

| | | |
|---|---|---|
| DE | 19540120 A1 | 5/1996 |
| DE | 69318956 T2 | 12/1998 |
| DE | 102011006422 A1 | 10/2012 |

* cited by examiner

*Primary Examiner* — Helen C Kwok
(74) *Attorney, Agent, or Firm* — Norton Rose Fulbright US LLP; Gerard Messina

(57) ABSTRACT

A micromechanical z-inertial sensor includes a substrate; a movable seismic mass in a micromechanical functional layer; a torsion spring connected to the movable seismic mass and about which the seismic mass able to rotate; an electrode layer below the seismic mass and that, in an outer region is connectible to a potential of the substrate and is connected to the seismic mass via an insulating layer; and electrodes at a distance above and below an inner region of the electrode surface.

6 Claims, 7 Drawing Sheets

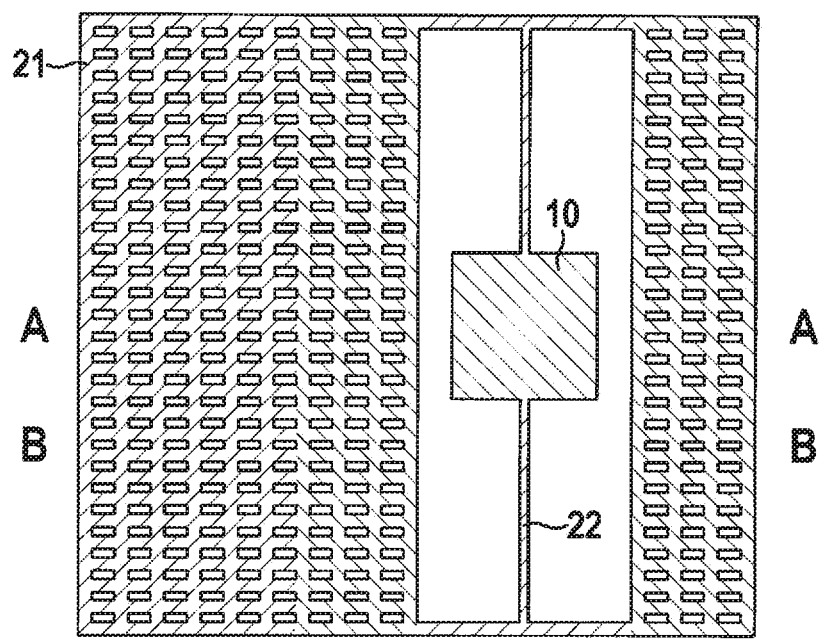
Fig. 2
(Prior Art)
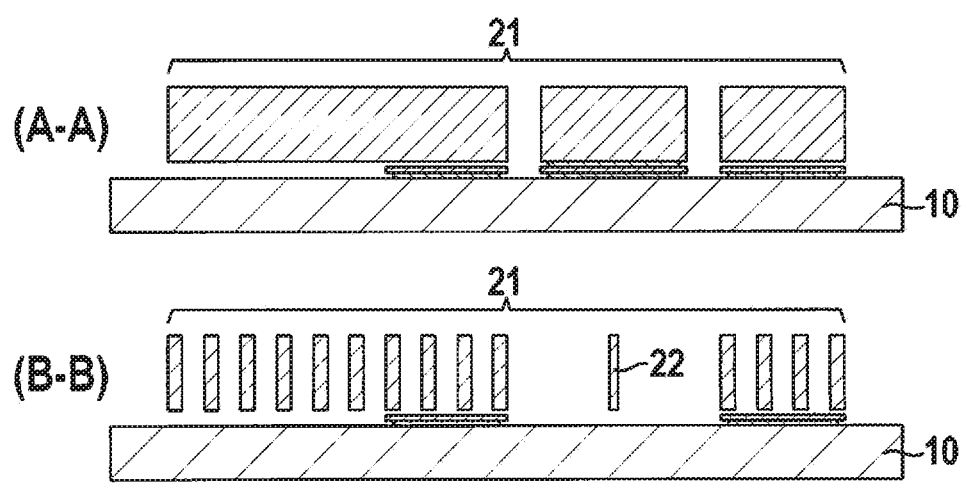
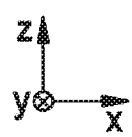
Fig. 3
(Prior Art)

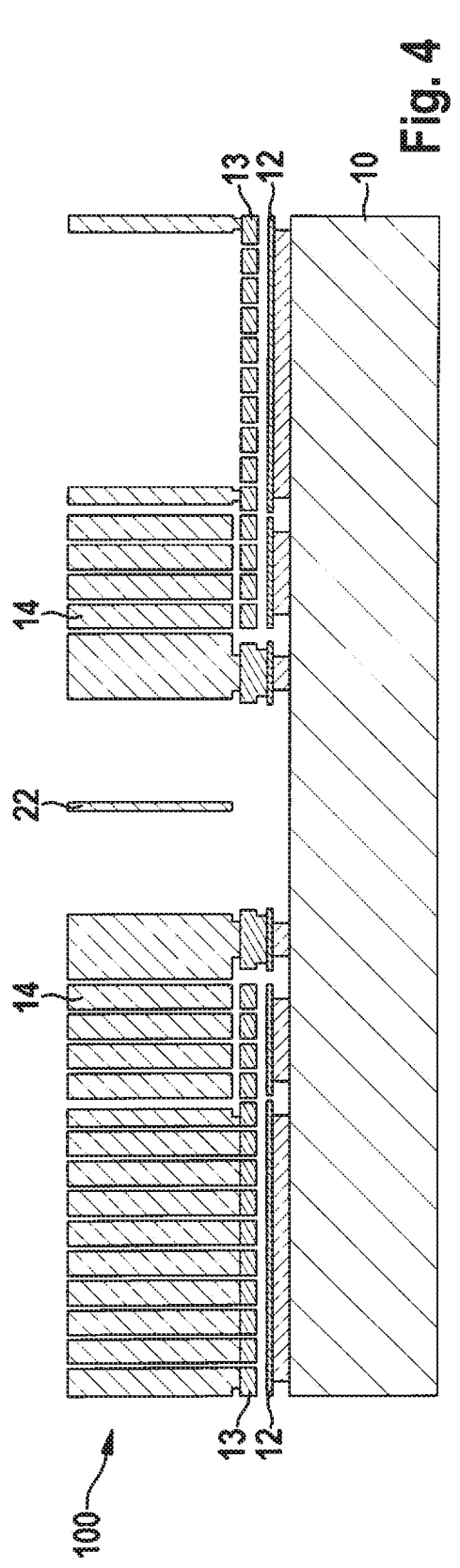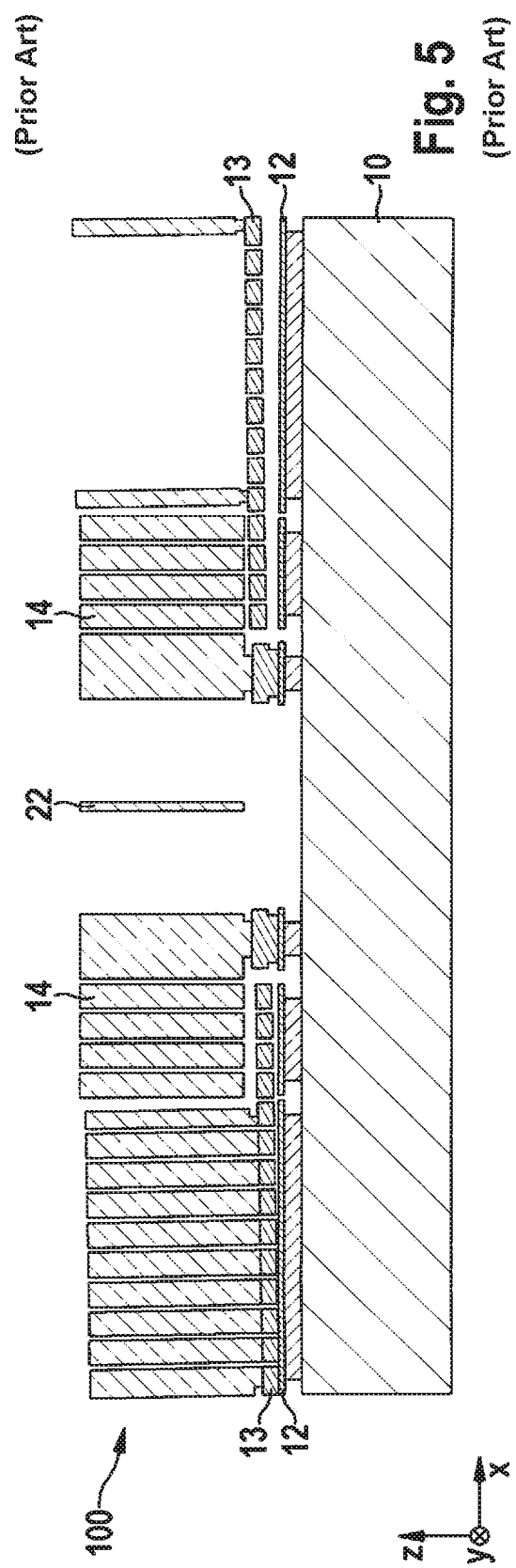

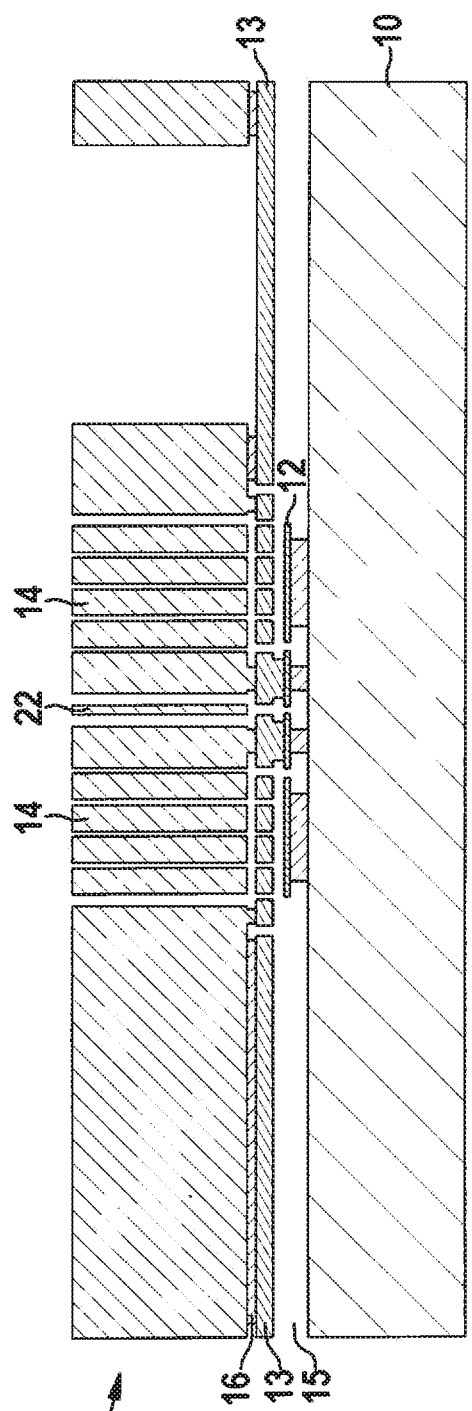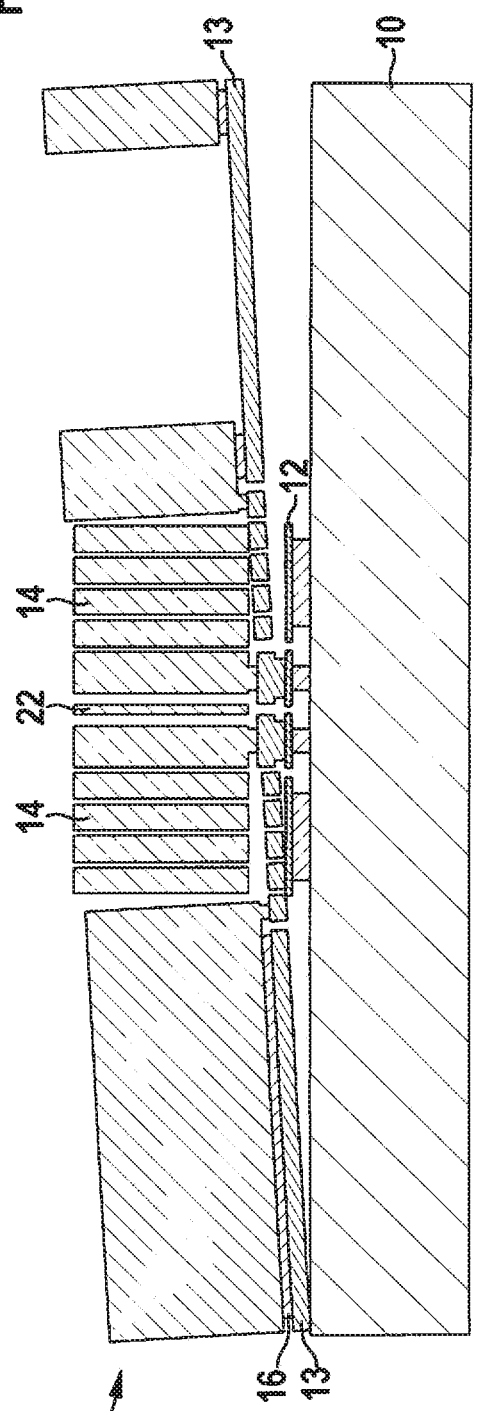

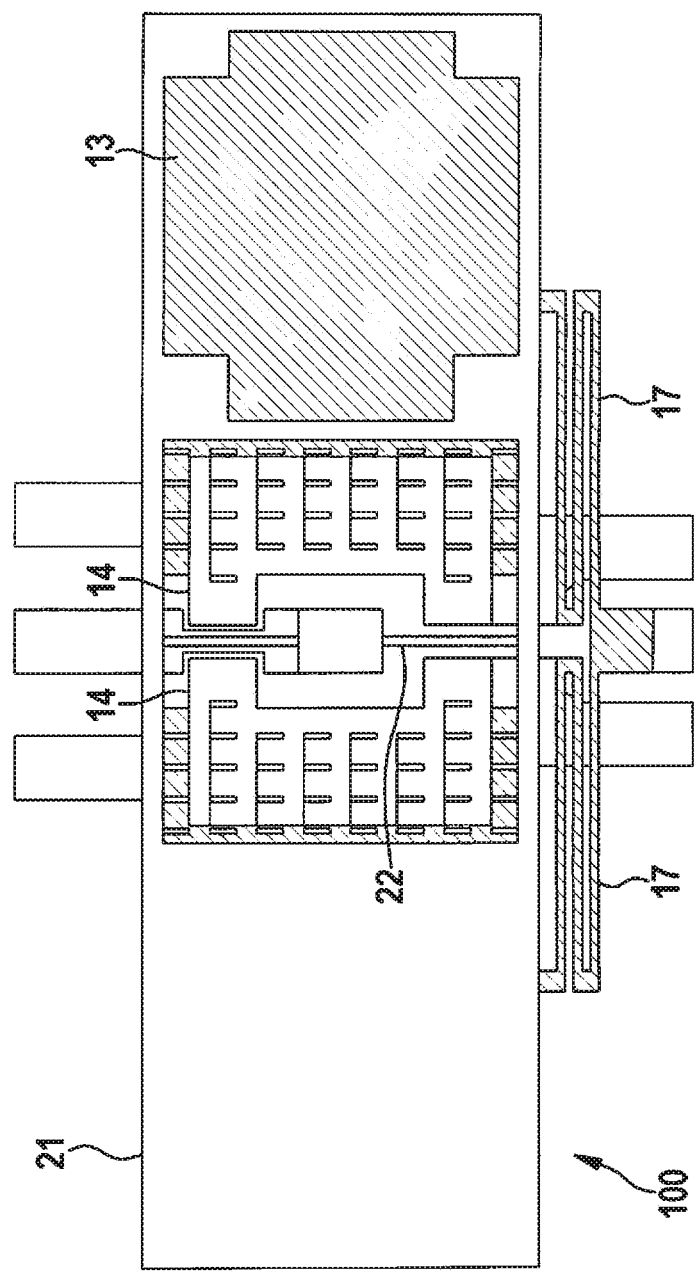

MICROMECHANICAL Z-INERTIAL SENSOR

CROSS-REFERENCE TO RELATED APPLICATIONS

The present application claims priority under 35 U.S.C. § 119 to DE 10 2018 209 500.0, filed in the Federal Republic of Germany on Jun. 14, 2018, the content of which is hereby incorporated by reference herein in its entirety.

FIELD OF THE INVENTION

The present invention relates to a micromechanical z-inertial sensor and to a method for manufacturing a micromechanical z-inertial sensor.

BACKGROUND

Known micromechanical acceleration or inertial sensors normally have MEMS structures. FIG. 1 shows a cross section through such a known acceleration sensor having movable MEMS structures 21, which are etched out of a thick micromechanical functional layer 20 made of polysilicon. These are situated above thin buried polysilicon layers 12, the latter for their part being anchored by an oxide layer 11 on a substrate 10. An oxide layer is also provided between the two polysilicon layers 12, 20.

In this instance, the buried polysilicon layer 12 is able to function as an electrical conductor track and/or as an electrode. The micromechanical functional layer 20 is exposed via a trench process and an oxide-sacrificial layer method. The buried polysilicon layer 12 is electrically isolated from substrate 10 by an oxide 11. The conductor tracks and electrodes are designed to be so wide that they are not completely undercut in the oxide-sacrificial layer etching step and are thus solidly anchored on substrate 10.

The movable MEMS structures 21 ("seismic mass") produced in this manner are usually sealed by a cap wafer 40 in the further process sequence. Depending on the application, a suitable internal pressure is thereby enclosed within volume 50, the sealing occurring usually via a seal-glass bonding method or via an eutectic bonding method, e.g., using AlGe.

In order to produce a z-acceleration sensor in a manufacturing process of this type, a rocker structure is developed in micromechanical functional layer 20, which is anchored on substrate 10 via torsion springs 22, as indicated in the top view of FIG. 2. The mass distribution of the rocker structure is designed asymmetrically, two electrode surfaces being situated below the rocker structure in order to be able to measure a deflection of the rocker structure capacitively.

A disadvantage of this system is that the symmetry of the system is altogether relatively low and that such a z-acceleration sensor can therefore exhibit an unfavorable operational performance.

A known z-acceleration sensor 100, which has a greater symmetry and a markedly better operational performance is shown in FIGS. 4 and 5. A z-acceleration sensor 100 of this type also has a rocker, additionally another polysilicon layer 13 being used between the micromechanical functional layer and the buried conductor track 12, which functions as an electrode layer. This additional polysilicon layer 13 can be used to produce a rocker that is symmetrical with respect to the surface, which has a different mass distribution so that the rocker additionally has a mass asymmetry. In this instance, the additional polysilicon layer 13 is used as a movable electrode of the rocker.

This consequently makes it possible to reduce the total mass of the rocker and to increase the mass asymmetry further in relation to the total mass. This also makes it possible to provide another fixed counter-electrode 14 above the movable electrode of the rocker, which is developed in the micromechanical functional layer. This advantageously makes it possible approximately to double the measuring capacity, the overall measuring system being arranged symmetrically with respect to the vertical z-direction. In order to be able to measure the small capacitance changes precisely when the rocker is deflected, the rocker must be isolated from substrate 10 in terms of potential, since otherwise the measurement becomes imprecise.

For such a micromechanical z-inertial sensor 100 it is important that, below the rocker, in areas in which no fixed measuring electrodes are provided, fixed electrode surfaces 12 are situated as shielding elements, which are at the same electrical potential as the rocker.

Without shielding element 12, the difference in potential between the substrate and the rocker would result in a distance-dependent additional force on the rocker, which would affect the signal of z-acceleration sensor 100 negatively.

The maximum deflection of such a rocker structure is shown in FIG. 5, where it can be seen that it is now limited by the distance between the additional polysilicon layer 13 and the buried conductor track 12, which functions as shielding element. This distance cannot be simply increased since otherwise the signal capacitance of z-inertial sensor 100 would be reduced with increased distance. In order to obtain an electrical signal that is as great as possible, fixed electrodes 14 are therefore situated as far as possible from the torsion axis 22 toward the outside. However, fixed electrodes 14 cannot be situated arbitrarily far toward the outside since otherwise the mass asymmetry of the rocker would be too low and the measuring sensitivity of micromechanical z-inertial sensor 100 would thereby be disadvantageously reduced.

If a vertical temperature gradient is applied on z-inertial sensor 100, a radiometric effect is produced in the sensor. The gas atoms coming from the cold side have a lower speed than the gas atoms from the warm side. Impacts of these atoms of different speeds with the movable masses can produce forces on the movable mass.

The previously described known z-inertial sensor 100 having the asymmetrical rocker reacts very strongly to such gas dynamics in the form of an undesired deflection of the rocker. Even a symmetrical rocker still reacts to such a temperature gradient. This can be explained in that perforation holes 13a, 21a between the light and the heavy side of the rocker differ in the layer thickness, as a result of which different impulse transfers of the gas atoms occur in those places, which produce a force.

This can be seen in principle in the top view of FIG. 6. For a defined internal pressure and a target temperature, it is possible to adapt the size of the respective perforation in such a way that the two sides are in balance. Every change in temperature or pressure, however, brings the z-inertial sensor 100 again out of balance.

SUMMARY

It is therefore an objective of the present invention to provide a micromechanical z-inertial sensor while avoiding the above-mentioned disadvantages.

According to a first aspect, the objective is achieved by a micromechanical z-inertial sensor that includes: a substrate;

a movable seismic mass developed in a micromechanical functional layer; a torsion spring that is connected to the movable seismic mass, about which the seismic mass able to rotate; and an electrode layer situated below the seismic mass, where the electrode layer, in an outer region, is connectable to a potential of the substrate and is connected to the seismic mass via an insulating layer and where electrodes are developed at a distance above and below an inner region of the electrode surface.

In this manner, a higher deflection and at the same time an improved insensitivity vis-a-vis stress effects are advantageously achieved for the micromechanical z-inertial sensor. This makes it possible for the sensor to be deflected exclusively as a result of mechanical inertial forces and not as a result of force effects of electrical fields that are generated due to applied electric voltages. This is achieved in particular by the fact that a freedom from potential is provided in a defined region below the rocker.

According to a second aspect, the objective is achieved by a method for manufacturing an micromechanical z-inertial sensor, where the method includes: providing a substrate; providing a movable seismic mass in a micromechanical functional layer; providing a torsion spring that is connected to the movable seismic mass and about which the seismic mass able to rotate; providing below the seismic mass an electrode layer that is connectible to the potential of the substrate in an outer region and is connected to the seismic mass via an insulating layer; and providing electrodes at a distance above and below an inner region of the electrode surface.

In an example embodiment of the micromechanical z-inertial sensor, the electrode layer is divided into the inner and the outer region by an insulating channel developed circumferentially around the inner region. This makes it possible to produce in a simple manner a separation in terms of potential of the electrode layer in the inner region and the outer region.

In an example embodiment, the electrode layer and/or the seismic mass is developed without perforations in the outer region. This advantageously makes it possible to eliminate or at least greatly reduce an unfavorable impact of the radiometric effect.

In an example embodiment, the electrode layer and/or the seismic mass is developed in perforated fashion in the outer region. The perforated layer advantageously makes it possible to reduce a damping of the z-inertial sensor. This is useful, e.g., if sensors are to have damping properties of the same quality in all coordinate directions x, y, z.

In an example embodiment, the electrode layer is connectible to a potential of the substrate via a spring element. This advantageously makes it possible to combine an electrical conducting function with a spring function of the spring element.

In an example embodiment, a stiffness of the spring element is such that the spring element in the state of rest of the micromechanical z-inertial sensor prevents the rocker from tilting. This supports a favorable sensing behavior of the sensor.

The present invention is described below in detail with additional features and advantages with reference to several figures in which identical or functionally identical elements bear the same reference symbols. The figures are intended in particular to elucidate certain principles of the invention and are not necessarily executed true to scale. For the sake of clarity, it can be provided that not all reference symbols are drawn in all figures.

Disclosed method features result analogously from corresponding disclosed device features and vice versa. This means in particular that features, technical advantages, and embodiments concerning the method for manufacturing a micromechanical z-inertial sensor result in an analogous manner from corresponding embodiments, features, and advantages concerning the micromechanical inertial sensor and vice versa.

BRIEF DESCRIPTION OF THE DRAWING

FIG. 2 is a top view onto a conventional micromechanical z-inertial sensor.

FIG. 3 is a sectional view through a conventional micromechanical z-inertial sensor.

FIGS. 4 and 5 are sectional views through a conventional micromechanical z-inertial sensor.

FIGS. 7 and 8 are views of a micromechanical z-inertial sensor according to an example embodiment of the present invention.

FIG. 9 is a top view onto the micromechanical z-inertial sensor according to an example embodiment of the present invention.

DETAILED DESCRIPTION

Figure 1:
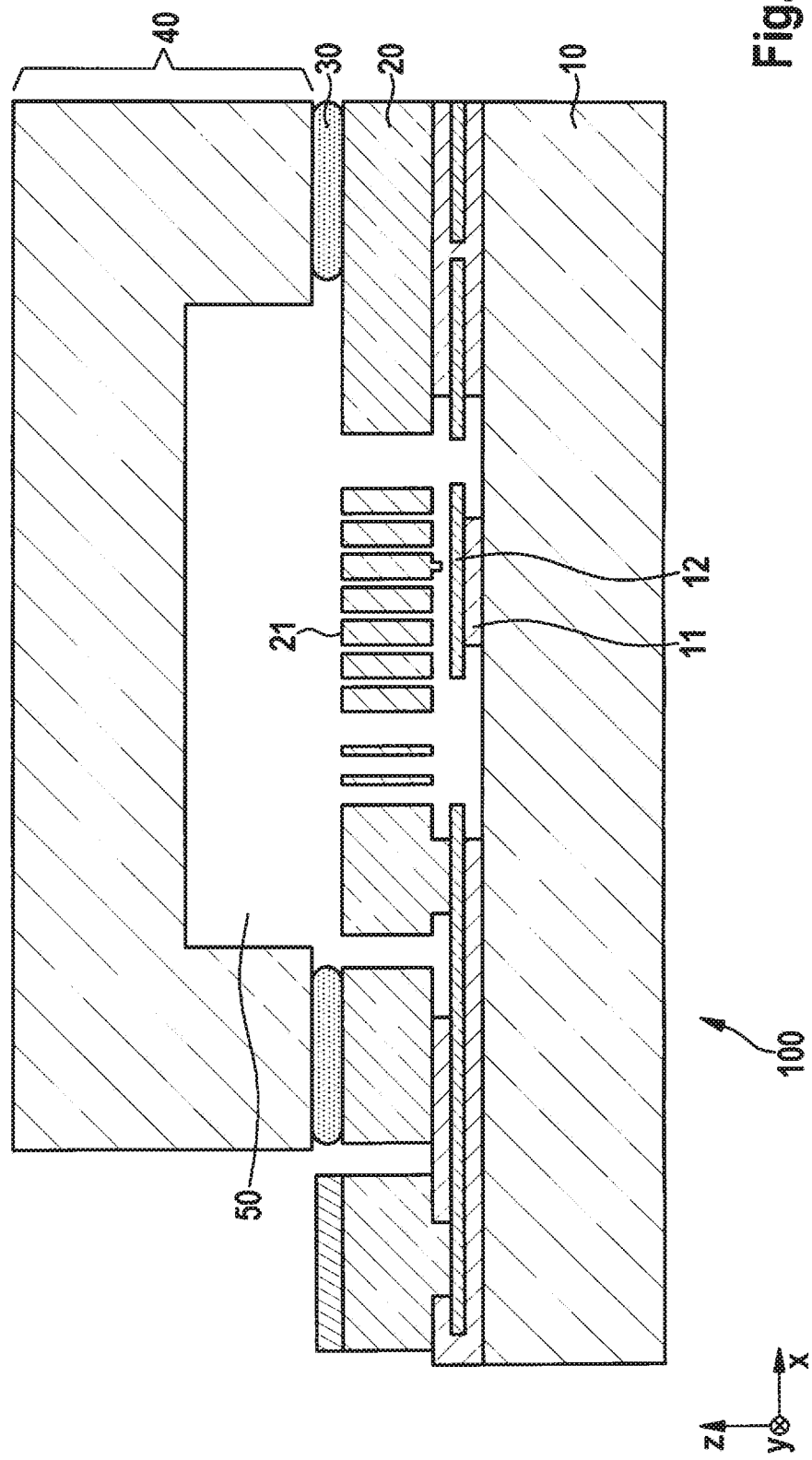
FIG. 1 is a cross-sectional view of a conventional micromechanical z-inertial sensor.
Figure 6:
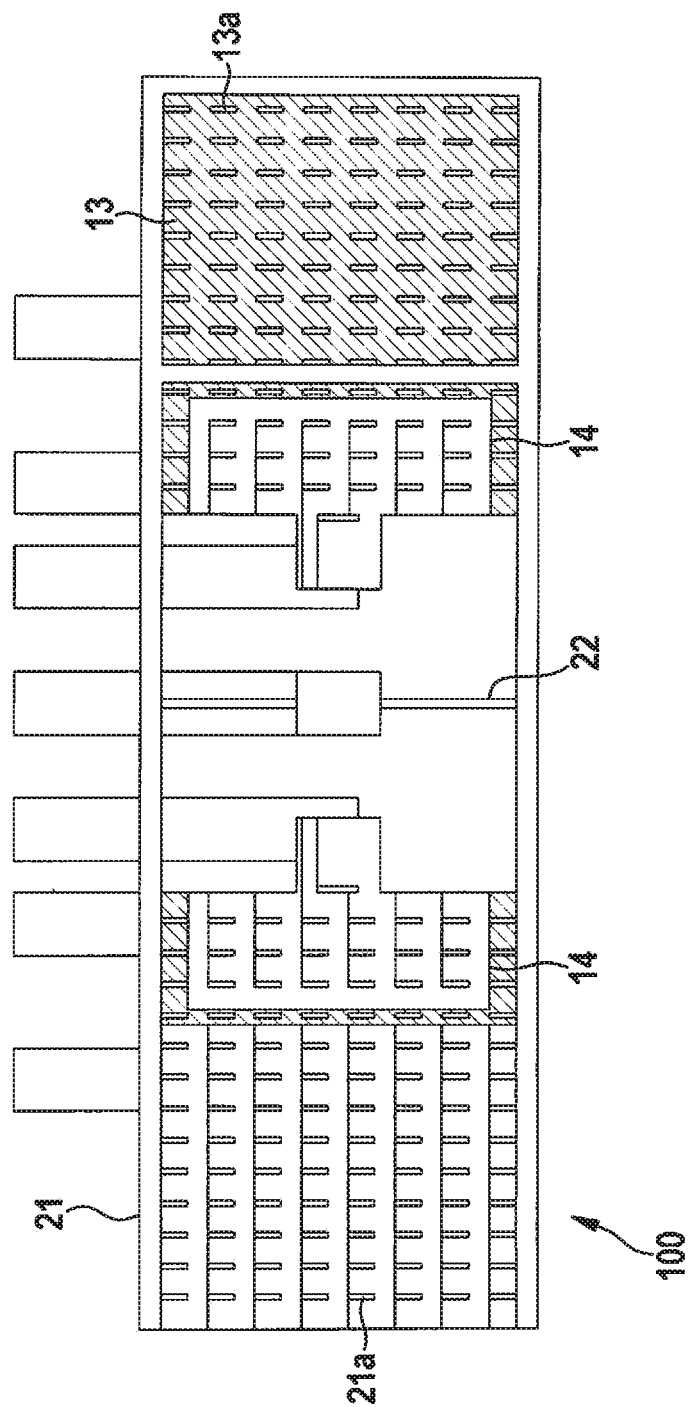
FIG. 6 is a top view onto a conventional micromechanical z-inertial sensor.

FIG. 7 is a cross-sectional view of a micromechanical z-inertial sensor 100 in a position of rest, according to an example embodiment of the present invention. It can be seen that the electrode layer 13 is situated below the movable rocker and is able to move along with the latter. Furthermore, it can be seen that polysilicon layer 12 is clearly smaller than in the known design and is limited to a central sensing region below the fixed electrodes 14. In this instance, electrode layer 13 is divided into a central region and an outer region by a circumferential continuous perforation channel. In this manner, electrode layer 13 and substrate 10 are able to be brought to the same electrical potential, as a result of which, in the operation of z-inertial sensor 100, electrode layer 13 has different electric potentials in the outer region and in the central sensing region.

This makes it possible that no electrical field occurs in the region of a cavity 15 below electrode layer 13, i.e., that the region is potential-free, and that a deflection of the rocker can be achieved exclusively by mechanical forces.

As can be seen in the cross-sectional view of FIG. 8, this advantageously makes it possible to achieve a greater freedom of movement of the rocker as compared to the conventional system. Below electrode layer 13, etching channels or cavities (not shown) are developed in a production process, which can be produced for example together with the patterning of polysilicon layer 12 of the buried conductor track.

Electrode layer 13 can be advantageously produced also without perforation holes 13a, whereby a rocker can be produced that is completely symmetrical with respect to a vertical gas flow. Optionally, electrode layer 13 can also be produced with perforation holes (not shown). Electrode layer 13 is furthermore coupled in mechanically rigid fashion to the rocker structure of seismic mass 21 via an insulating oxide layer 16.

For this purpose, regions (even without perforation) are provided in the micromechanical functional layer of the rocker structure that are sufficiently large so that an oxide layer 16 remains between the functional layer and electrode layer 13 in the sacrificial layer etching process. This makes it possible for electrode layer 13 to be upwardly mechanically connected to the rocker in the outer region by an insulating layer in the form of oxide layer 16. At the same time, all oxides below electrode layer 13 are completely removed in the sacrificial layer etching process due to the etching channels provided there.

The top view of the provided micromechanical z-inertial sensor 100 of FIG. 9 shows that via thin spring elements 17, which have a lower spring stiffness with respect to a tilting of the rocker, electrical conductor tracks are produced that keep electrode layer 13 at substrate potential. The thin spring elements 17 are advantageously arranged symmetrically with respect to the torsional direction of the rocker. In this manner, movable seismic mass 21 is able to hover potential-free in the outer region and is therefore maximally sensitive to mechanical forces only due to the mass asymmetry.

As a result it is possible advantageously to increase a maximum deflection of the rocker. It can be seen that, in contrast to the conventional system, the electrode surfaces of polysilicon layer 12 are limited to the central region of the rocker. The more central arrangement of fixed counter-electrodes 14 achieved in this manner makes the micromechanical z-inertial sensor 100 less susceptible to a bending of substrate 10, which typically occurs as a result of external influences when the component is soldered onto a circuit board and is thereby exposed to temperature fluctuations or is exposed to mechanical strains induced in other ways.

In the provided z-inertial sensor 100, the mass asymmetry is advantageously increased, as a result of which the sensor can be designed to be markedly more sensitive or a sensor of the same sensitivity can be produced in resource-saving fashion on a smaller surface.

The sensor thus becomes markedly less sensitive to pre-deflections of the rocker. Fundamentally, micromechanical z-acceleration sensors always have a small, statistically distributed pre-deflection due to variances in the manufacturing process. It is possible to compensate for the pre-deflection via a calibration method in an evaluation electronics, but, due to various effects, this results in nonlinearities and other undesired secondary effects. The greater freedom of movement of the rocker advantageously makes it possible to reduce greatly the effects in the signal path caused by the uniform pre-deflections.

The approach provided makes it possible to develop the rocker regions that are not situated below or above fixed electrodes 14 without perforation holes. This advantageously makes it possible markedly to increase a damping of z-acceleration sensor 100. The rocker can be designed to be completely symmetrical with respect to the geometry in the flow of gas from the lower side to the upper side. Static and dynamic effects, which occur when different temperatures or temperature gradients exist at the rocker between the upper side and the lower side and radiometric effects are produced in the sensor, affect the rocker symmetrically and are advantageously able to avoid tilting the rocker.

The provided structure is advantageously able to substantially reduce an adhesion in z-inertial sensors. In sensors having the same torsion spring, the greater maximum deflection of the sensors allows for sensors having a greater restoring force at the end stop, which reduces the adhesion propensity substantially. Advantageously, it is possible to produce smaller and thus more favorable z-acceleration sensors. As a result, an offset behavior of such a z-inertial sensor can be improved markedly.

Figure 10:
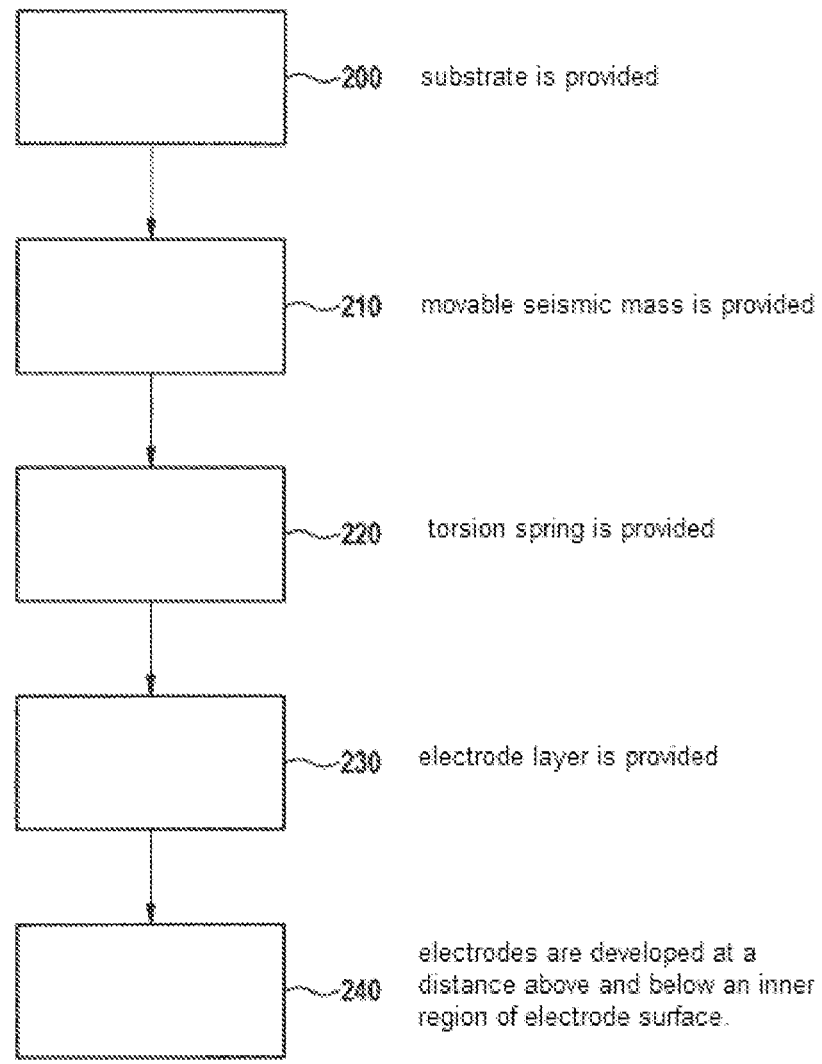
FIG. 10 is a flowchart of a method for manufacturing a micromechanical z-inertial sensor according to an example embodiment of the present invention.

FIG. 10 shows a basic sequence of a method for manufacturing a micromechanical z-inertial sensor 100. In a step 200, a substrate 10 is provided. In a step 210, a movable seismic mass 21 is provided in a micromechanical functional layer 20. In a step 220, a torsion spring 22 that is connected to the movable seismic mass 21 and about which the seismic mass able to rotate, is provided. In a step 230, an electrode layer 13 is provided below the seismic mass 21, the electrode layer 13 being connectible to the potential of substrate 10 in an outer region and being connected to seismic mass 21 via an insulating layer 16. In a step 240, electrodes 12, 14 are developed at a distance above and below an inner region of electrode surface 13. The order of the mentioned steps can also be switched in a suitable manner.

Although the present invention was described above with reference to concrete example embodiments, one skilled in the art is also able to implement example embodiments that were not disclosed above or that were disclosed above only partially, without deviating from the essence of the invention.

What is claimed is:

1. A micromechanical z-inertial sensor comprising:
   a substrate;
   a movable seismic mass in a micromechanical functional layer;
   a torsion spring that is connected to the movable seismic mass and about which the seismic mass is able to rotate;
   an electrode layer that is below the seismic mass and that, in an outer region of the electrode layer, is connectible to a potential of the substrate and is connected to the seismic mass via an insulating layer; and
   electrodes situated at a distance above and below an inner region of the electrode layer.

2. The micromechanical z-inertial sensor of claim 1, wherein the outer and inner regions of the electrode layer are connectible to different electrical potentials and are divided by an insulating channel that is circumferentially around the inner region.

3. The micromechanical z-inertial sensor of claim 1, wherein, at the outer region, at least one of the electrode layer and the seismic mass is unperforated.

4. The micromechanical z-inertial sensor of claim 1, wherein at least one of the electrode layer and the seismic mass is perforated at the outer region.

5. The micromechanical z-inertial sensor of claim 1, wherein the electrode layer is connectible to a potential of the substrate by a spring element.

6. The micromechanical z-inertial sensor of claim 5, wherein a stiffness of the spring element is such that the spring element in a state of rest of the micromechanical z-inertial sensor prevents the rocker from tilting.

* * * * *